United States Patent [19]

Woyke et al.

[11] Patent Number: 5,093,584
[45] Date of Patent: Mar. 3, 1992

[54] SELF CALIBRATING TIMING CIRCUIT

[75] Inventors: Justin A. Woyke, Essex Junction; Orest Bula, Shelburne; Garrett S. Koch, Cambridge, all of Vt.; Richard S. Gomez, Forest Grove, Oreg.

[73] Assignee: International Business Machines Corporation, Armonk, N.Y.

[21] Appl. No.: 681,626

[22] Filed: May 6, 1991

Related U.S. Application Data

[63] Continuation of Ser. No. 400,624, Aug. 30, 1989, abandoned.

[51] Int. Cl.[5] .......................... H03K 5/13; H03L 7/00
[52] U.S. Cl. ................................... 307/269; 307/268; 307/265; 307/246; 328/63
[58] Field of Search ................ 307/269, 268, 263, 265, 307/352, 353, 246; 328/63, 72

[56] References Cited

U.S. PATENT DOCUMENTS 4,037,162 7/1977 Bumgardner ........................ 307/352
4,914,319 4/1990 Hashimoto ........................... 307/353

Primary Examiner—Timothy P. Callahan
Attorney, Agent, or Firm—Francis J. Thornton

[57] ABSTRACT

A clock circuit, together with a control current generator and a ratio circuit coupled thereto. The ratio circuit, of the invention, utilizes at least two capacitors each of which is coupled in series with a respective transistor and arranged in parallel with one another. Each capacitor transistor transistor pair is in parallel to the other and coupled between the control current generator and ground so that at least one of the transistors in a selected capacitor transistor series can be selectively turned off while the other can be directly controlled by the clock cycle. This circuit, generates timing edges within a clock cycle which timing edges can be any fraction of the clock cycle, and comprises a clock, a controlled current generator, and a ratio circuit coupled to the clock and the generator. Preferably this ratio circuit comprises at least two capacitor-transistor pairs coupled in parallel between the generator and ground with the clock being coupled to the control electrode of one of the transistors and being coupled to the control electrode of the other transistor together with a turn-off signal source. An element for discharging the capacitors is included in the circuit.

10 Claims, 3 Drawing Sheets

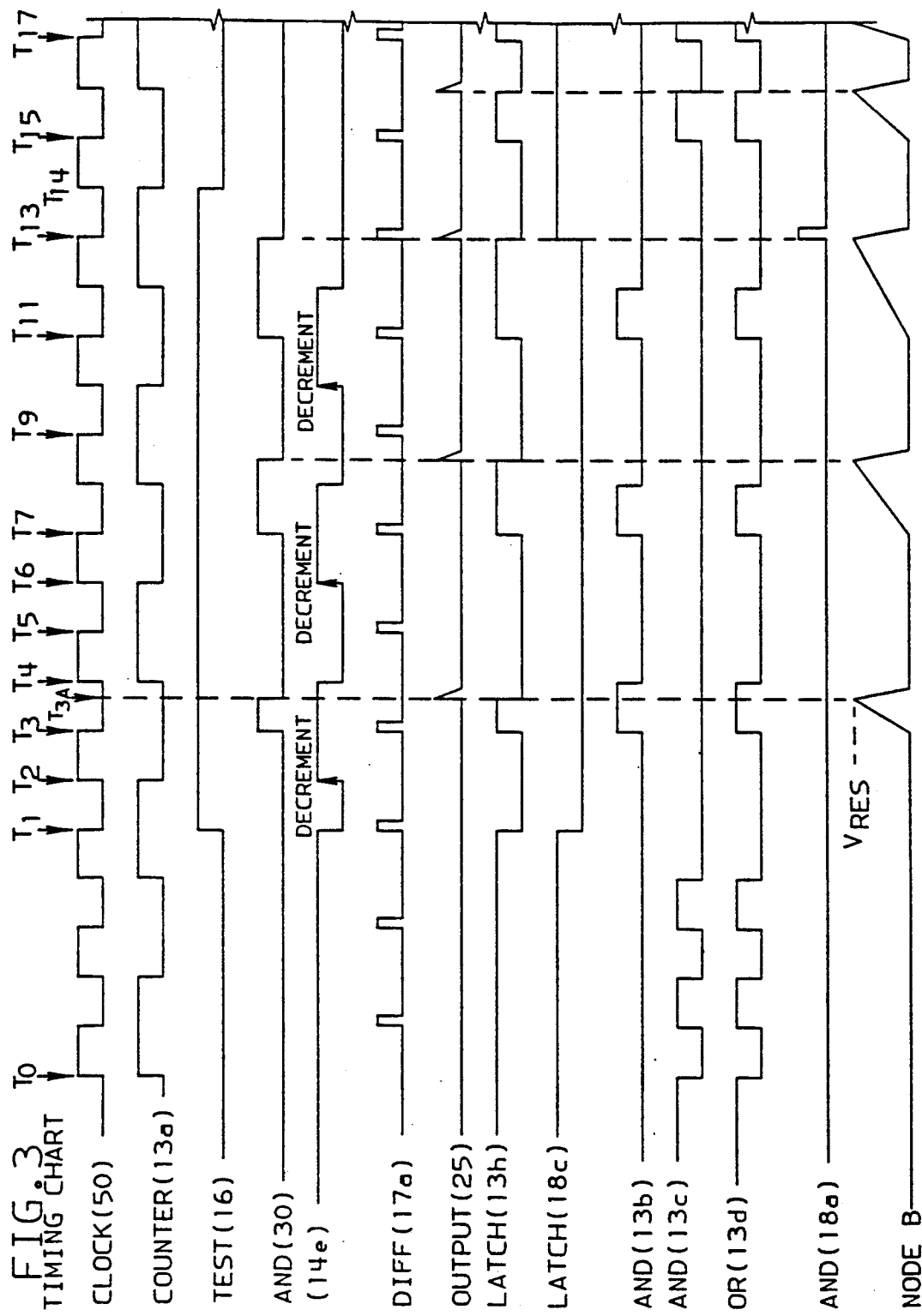

SELF CALIBRATING TIMING CIRCUIT

RELATED APPLICATION

This is a continuation of application Ser. No. 07/400,604, filed on Aug. 30, 1989 (now abandoned).

BACKGROUND OF THE INVENTION

1. Field Of The Invention

This describes a self calibrating timing circuit and more particularly a timing circuit that uses a ratio of two capacitors to generate sub-cycles of a main clock frequency to create timing edges that are independent of the main clock frequency.

2. Description Of The Prior Art

Often in complex digital systems such as microprocessors it is necessary to have multiple timing edges upon which all the sequential events are based. In the past there has been used various techniques to produce such timing edges by delaying one or more edges of a reference clock signal, such as using RC circuits or delay lines. The prior art circuits however had problems with noise and accuracy due to sensitivity to temperature and process variations in the making of the devices comprising the delay circuit. These problems caused the delay generated to vary. Such variations can cause digital logic systems to malfunction. Still, other prior art systems used voltage controlled oscillators to provide control voltages to the controlled stages of tapped delay lines or used multiple capacitors that were varied with switches. Such other systems encountered similar problems and had undesirable side effects.

Thus, in microcircuitry requiring precision compact, low power timing circuits, a need has continually existed for stable, noise free, low power and easily variable timing circuits.

SUMMARY OF THE INVENTION

Accordingly, the present invention resolves these problems with a precision, compact, low power timing circuit that generates substantially noise free and temperature insensitive precision timing edges which are not multiples or fractions of the timing clock and does this, without the need for precision analog capability, by a ratio capacitor circuit.

The present invention is superior to those circuits known in the prior art since it is not limited to multiples or fractions of the main clock frequency, yet is more stable, less prone to noise problems, simpler, cheaper and easier to build than the prior art circuits while having the capability of being self calibrating, readily adjustable, faster and easily extendable with an accuracy independent of the absolute value of the components used.

More specifically, the present invention comprises a ratio circuit coupled to a clock and a control current generator. The ratio circuit, of the invention, utilizes at least two capacitors each of which is coupled in series with a respective transistor and arranged in parallel with one another. Each capacitor transistor pair is in parallel to the other and coupled between the control current generator and ground so that at least one of the transistors in a selected capacitor transistor series can be selectively turned off while the other is directly controlled by the clock cycle. Means for charging and discharging the capacitors are included in the circuit.

The present invention is thus a circuit, for generating timing edges within a clock cycle which timing edges can be any function of the clock cycle.

DESCRIPTION OF THE DRAWINGS

FIG. 3, is a timing diagram showing pulses appearing at various nodes of the circuit of FIG. 1.

The invention will now be described in conjunction with FIGS. 1-3.

DESCRIPTION OF THE PREFERRED EMBODIMENT

Figure 1:
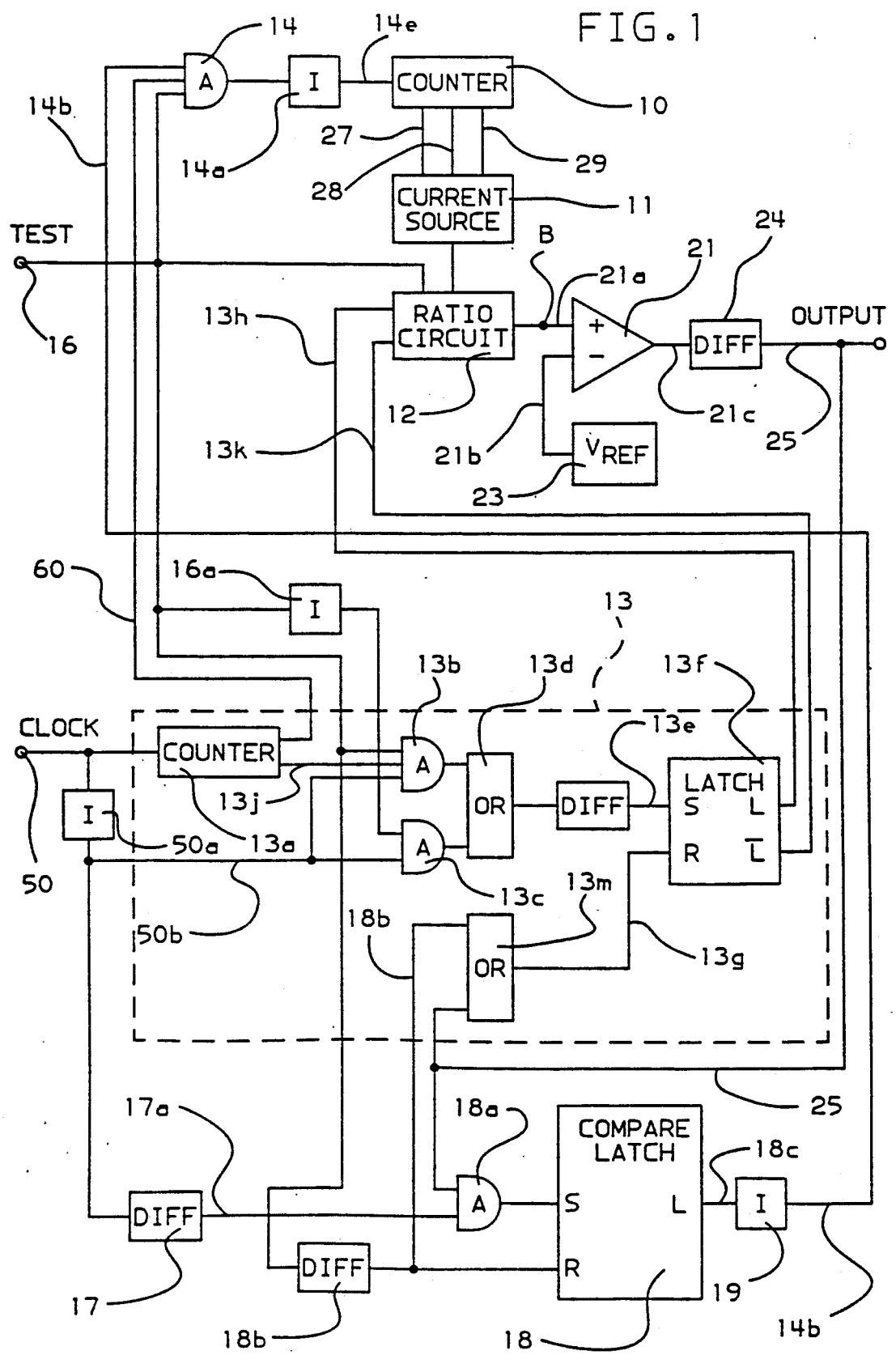
FIG. 1, illustrates an overall block diagram of a system using the ratio circuit of the invention.

In FIG. 1, there is shown a block diagram of a circuit for obtaining precision timing pulses independent of the input clock signals used.

Basically, this circuit comprises a counter 10 for counting a designated number of transitions and, at selected times, causing a current source circuit 11 to send selected current levels to a ratio circuit 12. A control logic circuit 13 which is comprised of a counter 13a, two AND circuits 13b and 13c, two OR circuits 13d, and 13m, a differentiating circuit 13e and a latch circuit 13f, sends a control signal on line 13h and a reset signal on line 13k to the ratio circuit 12. The counter 13a of the control logic circuit 13 is coupled to a clock 50, to AND circuit 13b, and via line 60 to a first input of a three input AND circuit 14 whose output is directed through inverter 14a into counter 10. The clock 50 is coupled not only to the counter 13a but also, through invertor 50a, to the AND circuits 13b and 13c, and to a differentiating circuit 17.

A test signal source 16 is coupled directly to the ratio circuit 12, to the AND circuits 14 and 13b, to differentiating circuit 18b and through an inverter 16a to the AND circuit 13c. The differentiating circuit 18b is coupled to reset of latch 13f through OR 13m. The ratio circuit 12 is coupled to an input 21a of a differential amplified 21 which has a reference voltage source 23 coupled to its other input 21b. The output 21c of this differential amplifier 21 is in turn transmitted through a differentiating circuit 24 to the circuit output 25, and thence to the latch 13f through OR 13m of the control logic circuit 13, and also to the compare latch 18 through AND gate 18a. The output of AND 13b is connected to OR 13d, with the output of AND 13c connected to the other input of OR 13d. The output of OR 13d is connected through differentiating circuit 13e to latch 13f.

The output of the differentiating circuit 17, is connected to a latch 18 through an AND circuit 18a where the output of the differentiating circuit 17 is anded with the output 25 to set latch 18, which is reset by to the output of the differentiating circuit 18b. When the desired comparison is made the output of latch 18 is inverted by inverter 19 and coupled into a second input of AND circuit 14.

Figure 2:
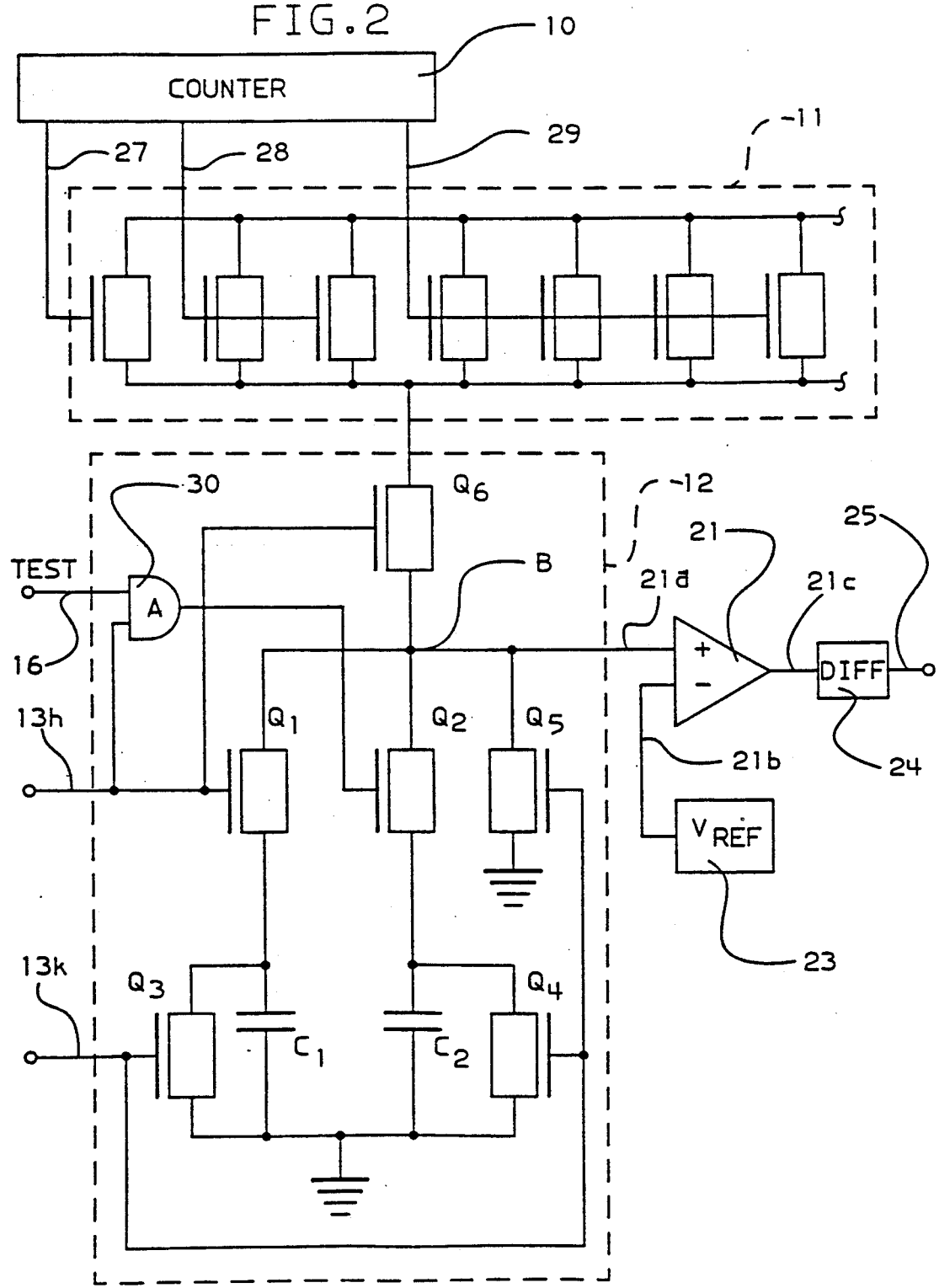
FIG. 2, illustrates a detailed schematic of the ratio circuit of the present invention.

The ratio circuit 12 of FIG. 1 is shown in greater detail in schematic form in FIG. 2. As shown in FIG. 2 this circuit is comprised of six transistors Q1, Q2, Q3, Q4, Q5 and Q6 together with two capacitors C1 and C2 of different capacitive value and an AND gate 30. If desired, it should be clearly understood that this AND gate 30 could be separate from and outside of the ratio circuit itself. In FIG. 2 it should be noted that the test signal 16 is supplied into the AND gate 30 together with the signal from latch 13f on line 13h. This latching signal line 13h is also connected to the gates of transistors Q1 and Q6. The other line 13k from latch 13f is connected to the gates of transistors Q3, Q4 and Q5. The output of AND gate 30 is coupled to the gate of transistor Q2. As shown in FIG. 2 transistors Q1 and Q2 have their sources coupled to a common node B and their drains coupled to ground through respective capacitors C1 and C2 and respective reset transistors Q3 and Q4. Transistor Q6 has its source coupled to the output from the current source circuit 11 and its drain coupled to node B while transistor Q5 has its source coupled to node B and its drain coupled to ground.

DESCRIPTION OF OPERATION FIG. 3 shows a timing diagram setting forth the pulses seen at by selected nodes and circuits set forth in FIGS. 1 and 2.

Initially, it is assumed that the clock 50 has been running and that the test input 16 is held low. It is also assumed that the counter 10 is reset, i.e. all positions are off, and that the ratio circuit 12 is not being supplied current from current source 11. Thus node B in ratio circuit 12 is not changing in voltage and the output 25 is low.

At time T0 the clock 50 rises and counter 13a turns on and becomes latched into a first condition where it will remain until the clock again goes positive. In this latched condition counter 13a passes a positive signal via line 60 to AND circuit 14. However, because test node 16 is low the AND circuit 14 remains off holding line 14e high. The AND circuit 30 in ratio circuit 12 as shown in FIG. 2 also remains off. Thus, the gate of transistor Q2 is held low and transistor Q2 remains off.

At time T1, when clock 50 goes low, the differentiating circuit 17 emits a positive pulse, but since amplifier 25 is low, the AND circuit 18a remains off. Simultaneously the test signal source 16 goes high. When test signal source 16 goes high the differentiating circuit 18b emits a positive going signal (not shown) which causes the latches 13f and 18 to both be reset. When latch 13f becomes reset, line 13h goes low and simultaneously the signal from latch 18 passes through inverter 19 causing line 14b, coupled to AND circuit 14, to go positive. With positive input signals received, from counter 13a on line 60, from the test source 16, and the inverter 19 on line 14b, the AND circuit 14 emits a positive signal which is inverted by the inverter 14a and passed as a negative signal into the counter 10 via line 14e. Since counter 10 decrements only when a positive transition is received on its input line 14e no change in the status of counter 10 occurs. Also at time T1 the output line 13h of latch circuit 13f goes low holding transistors Q1 and Q6 off, and line 13K is now high turning on transistors Q3, Q4 and Q5 causing node B to remain low and the capacitors C1 and C2 remain discharged. At this time T1 the circuit is initialized and ready for operation.

At time T2 the clock 50 again goes positive causing the counter 13a, to go negative and send a negative signal along line 60 to the AND circuit 14. Simultaneously, the line 13j going to AND circuit 13b goes high, but since the clock 50 has gone high, the inverter 50a causes a negative signal to appear on line 50b thus holding the AND circuit 13b off. When line 60 goes low, the AND circuit 14 shuts off and the inverter circuit 14a causes a positive signal to appear on line 14e at the input of counter 10 causing counter 10 to decrement. The decrementation of counter 10 turns on current source 11 thus supplying maximum current to ratio circuit 12. However, because line 13h remains low transistors Q1, Q2 and Q6 all remain off while transistors Q3, Q4 and Q5 all remain on, thus node B remains low.

At time T3 the clock signal 50 again goes negative without affecting the state of counter 13a which remains low, and line 50b goes high enabling the AND circuit 13b and the OR circuit 13d, thus causing the line 13e leading from the differentiating circuit to rise and to set the latch 13f. When 13f becomes set, line 13h goes high and line 13K goes low. When 13h rises transistors Q1, Q2 and Q6 turn on and transistors Q3, Q4 and A5 in ratio circuit 12 turn off. This permits current, from current source 11, to be fed into the parallel combination of capacitors C1 and C2 causing node B to rise in voltage until it equals the voltage reference source 23. It should be noted that the level of voltage reference source 23 is determined by the operating range of the capacitors C1 and C2. At time T3A, when node B reaches the value of the reference voltage source 23, the comparator circuit 21 goes from low to high and the differentiating circuit 24 emits a positive pulse on output line 25. This output pulse on line 25 being fed to the OR circuit 13m and the AND circuit 18a resets the latch 13f through the OR circuit 13m and also conditions one leg of the AND circuit 18a. Because latch 13f has been reset line 13k goes high turning on transistors Q3, Q4 and Q5 and drives line 13h low turning off transistors Q1, Q2 and Q6. This discharges C1 and C2 and brings node B low in preparation for the next charge and discharge cycle. Because line 13e is low the latch 13f is not altered and line 13k remains high and line 13h remains low.

Because the clock is not in a transition phase from positive to negative the AND gate 18a is not enabled and the pulse from the differentiator circuit 17 is not coincident in time with the output line 25. The AND gate 18a is not enabled and compare latch 18 remains in its unset or low condition.

At time T4 the clock again goes high and the counter input line 14e goes low. Again, the clock continues until time T6 when upon a rising clock pulse, the line 14e again goes positive causing the counter 10 to again decrement, thus the same charge and discharge cycle that was initiated at clock cycle T2 is repeated. In this instance with counter 13a going low line 60 also falls causing line 14e, the input of the counter 10, to rise decrementing the counter 10 by one count thus changing the setting of current source 11 resulting in slightly less current to charge capacitors C1 and C2 and the ratio circuit. This smaller current from the current source takes a slightly longer time to charge the two capacitors C1 and C2. Again, however, the rise of the differentiating output 17a, does not correspond to the rise in output 25, and again latch 18 is not enabled and the capacitors C1 and C2 are again discharged as described above. The cycle again repeats until at time T13, still smaller current from the current source requires a charging time, to charge capacitors C1 and C2, sufficient such that the pulse on output 25 and the output 17a of differentiating circuit 17 are coincident in time as detected by the AND gate 18a. The compare latch 18 is then set making 18c high and the output of inverter 19 low, thus disabling the AND gate 14 and no further decrement of the counter 10 can occur. The compare latch 18 is now set with line 18c being high and causes external circuits (not shown) to reset the test circuit 16 on the next positive transition time T14 of clock 50, thus disabling the AND gate 13b and the AND gate 14, but enabling the AND gate 13c for normal operations.

At time T15, T17,... the clock 50 again transitions low driving the line 50a high conditioning the AND gates 13c and 13d and setting the latch 13f so that line 13h goes high. Because the test line 16 is low the AND gate 30 does not become set and transistor Q2 remains off. Counter 10 was set to its proper value during the test mode and the current from the current source 11 now charges only capacitor C1. This occurs at a time shorter than the time between successive low transitions of clock 50 and thus provides an accurate sub-cycle timing generator which will continue to repeat until test 16 again rises and the cycle described above between pulses T2 and T13 repeats.

By producing the above described transistor-capacitor ratio circuit in a single semiconductor chip significant advantages can be realized in creating and determining the ratio and self tracking aspects of the transistors and capacitors of the ratio circuit.

For example, the capacitors C1 and C2 can be either of equal values or of different value depending on the ratio desired.

Having now described the present invention it should be obvious to one skilled in the art that various changes in mode in the desired preferred embodiment by one skilled in the art can be made without altering the inventive concept set forth herein.

What is claimed is:

1. A self calibrating circuit comprising:
   a clock, generating a plurality of clock cycles of a selected frequency,
   a current generator,
   a test signal source, and
   a ratio circuit coupled to the clock, the current generator, the test signal source, and an output,
   said ratio circuit comprising,
   a pair of transistors, each transistor of said pair of transistors being coupled to the output and in series with said generator and with a respective capacitor,
   each transistor of said pair of transistors further having a control electrode,
   one transistor of said pair of transistors having its control electrode coupled to and driven by said clock, and the other of said pair of transistors having its control electrode coupled to said signal source and said clock, said other of said pair of transistors being selectively turned on by the simultaneous application of a signal from said test signal source and one clock cycle of said plurality of clock cycles, whereby said capacitor can be selectively charged
   switching means for discharging each of said capacitors.

2. The circuit of claim 1 wherein said transistors and said capacitors are created in the same semiconductor chip.

3. The circuit of claim 1 wherein said capacitors of different capacitive value.

4. The circuit of claim 1 wherein said capacitors are of equal value.

5. The circuit of claim 1 wherein said means for discharging said capacitors are coupled to said clock.

6. The circuit of claim 1 wherein the other of said pair of transistors is coupled to and driven by the clock and the signal source through an AND circuit.

7. The circuit of claim 1 wherein there is further provided an operational amplifier coupled to said pair of transistors and to a reference voltage source.

8. The circuit of claim 1 wherein said current generator includes means for producing current over varying time sequences.

9. The circuit of claim 1 wherein there is further provided counter means coupled to said current generator means for decrementing said current generator.

10. A circuit for generating timing edges within a clock cycle comprising:
    clock means,
    means for generating a controlled current, and
    a ratio circuit coupled to an output, said clock means and said generating means,
    said ratio circuit comprising; at least two capacitors and two transistors,
    each of said transistors having a control electrode,
    each of said capacitors being coupled in series with a respective transistor to form a respective capacitor transistor series,
    each one of said capacitor transistor series being coupled in parallel between said controlled current generating means and ground,
    said clock means being directly coupled to the control electrode of the transistor of one of said capacitor transistor series whereby the capacitor to said one of said capacitor transistor series can be charged,
    means coupled to the control electrode of the transistor in the other of said capacitor transistor series for selectively turning off the transistor in the other of said capacitor transistor series, whereby the capacitor of said other transistor capacitor series can be charged
    switching means for discharging said capacitors.

* * * * *